United States Patent
Wang

(10) Patent No.: US 7,709,850 B2
(45) Date of Patent: May 4, 2010

(54) PIXEL STRUCTURE AND FABRICATION METHOD THEREOF

(75) Inventor: Ching-Yi Wang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 711 days.

(21) Appl. No.: 11/557,957

(22) Filed: Nov. 8, 2006

(65) Prior Publication Data
US 2007/0275518 A1    Nov. 29, 2007

(30) Foreign Application Priority Data
May 29, 2006    (TW) ............................ 95118961 A

(51) Int. Cl.
H01L 27/16    (2006.01)
(52) U.S. Cl. ............... 257/98; 257/350; 257/E29.052; 257/E29.291; 257/E29.294; 257/E21.414; 438/29; 438/152; 438/158
(58) Field of Classification Search ............... 257/98, 257/350, E29.052, E29.291, E29.294, E21.414; 438/29, 30, 152, 158
See application file for complete search history.

(56) References Cited

U.S. PATENT DOCUMENTS
6,197,624 B1 *   3/2001   Yamazaki ................... 438/158

FOREIGN PATENT DOCUMENTS

| JP | 8-250742 | 9/1996 |
|---|---|---|
| JP | 11-281997 | 10/1999 |
| JP | 2002-311448 | 10/2002 |
| KR | 1020020050017 | 6/2002 |
| KR | 20040092532 | 11/2004 |

* cited by examiner

Primary Examiner—M. Wilczewski
Assistant Examiner—Toniae M Thomas
(74) Attorney, Agent, or Firm—Jianq Chyun IP Office

(57) ABSTRACT

A pixel structure and a fabrication method thereof are provided. The pixel comprises a substrate, a gate, a gate insulating layer, a channel layer, a first source/drain, a second source/drain, a dielectric layer, a first pixel electrode, and a second pixel electrode. The gate is disposed on the substrate and is covered by the gate insulating layer. The channel layer is disposed on the gate insulating layer above the gate. The first source/drain and the second source/drain are disposed on the channel layer. The channel layer has different thicknesses respectively corresponding to the first drain/source and the second drain/source. The dielectric layer covers the substrate and exposes the first and the second drains. The first and the second pixel electrodes are disposed on the dielectric layer, and are electrically connected to the first and the second drains respectively.

13 Claims, 14 Drawing Sheets

PIXEL STRUCTURE AND FABRICATION METHOD THEREOF

CROSS-REFERENCE TO RELATED APPLICATION

This application claims the priority benefit of Taiwan application serial no. 95118961, filed May 29, 2006. All disclosure of the Taiwan application is incorporated herein by reference.

BACKGROUND OF THE INVENTION

1. Field of the Invention

The present invention relates to a pixel structure and a fabrication method thereof. More particularly, the present invention relates to a pixel structure capable of achieving an effect of wide view angle and a fabrication method thereof.

2. Description of Related Art

The rapid progress of the multimedia society relies much on the remarkable improvement of semiconductor devices or human-machine display devices. As for displays, cathode ray tubes (CRT) have occupied the market for many years due to its advantageous high display quality and low cost. However, for operating a plurality of terminals and/or displays on the desktop, along with the rising "environmental protection" awareness and the increasing demands for saving energy, CRTs have a limited advantage such as larger space utilization and cannot satisfy the current market demands of light, thin, short, small and power-saving displays. Therefore, the thin film transistor liquid crystal display (TFT-LCD), having superior features such as high image quality, smaller space utilization, low power consumption, and no radiation, has become the mainstream display product of the market.

Recently, the market demands for the LCDs having the advantages of achieving high contrast ratio, rapid response, wide view angle and the like. Currently, techniques for achieving wide view angle include twisted nematic plus wide viewing film (TN+film), in-plane switching (IPS), and multi-domain vertical alignment (MVA), etc.

However, the alignment techniques described above have the disadvantages of complicated processes and poor production yield. As for the MVA, as alignment protrusions or slits are required to be formed on the substrates on two sides of the liquid crystal layer, an additional mask process is required, thus resulting problems such as difficulty in making LCD panels flimsier, low optical transmittance of the backlight sources, and light leakage in the dark state. Therefore, the manufacturing cost of LCD panels is increased, and the production yield is lowered.

SUMMARY OF THE INVENTION

Accordingly, one objective of the present invention is to provide a pixel structure, which has advantages of achieving the effect of wide view angle and be fabricated using a simple fabrication process with high production yield.

Another objective of the present invention is to provide a method of fabricating the aforementioned pixel structure, in which the effect of different liquid crystal alignments in a same pixel region can be achieved without using an additional mask.

In order to achieve the aforementioned or other objects, the present invention provides a pixel structure, which comprises a substrate, a gate, a gate insulating layer, a channel layer, a first source/drain, a second source/drain, a patterned dielectric layer, a first pixel electrode, and a second pixel electrode. The gate is disposed on the substrate, and the gate insulating layer covers the gate. The channel layer is disposed on the gate insulating layer above the gate. The first source/drain and the second source/drain are disposed on the channel layer. The channel layer has different thicknesses respectively corresponding to the first drain/source and the second drain/source. The patterned dielectric layer covers the substrate, and exposes a part of the first drain and a part of the second drain. The first and the second pixel electrodes are disposed on the dielectric layer, and are electrically connected to the first drain and the second drain respectively.

In an embodiment of the present invention, the aforementioned pixel structure further comprises an ohmic contact layer disposed between the channel layer and the first source/drain and between the channel layer and the second source/drain. The material of the ohmic contact layer is, for example, doped amorphous silicon.

In an embodiment of the present invention, the surface of the gate corresponding to the second source/drain has at least a recess.

In an embodiment of the present invention, the first source/drain and the second source/drain have a common source.

The pixel structure of the present invention achieves the effect of MVA of liquid crystal without arranging another means such as alignment protrusions and slits. Therefore, the pixel structure of the present invention facilitates to flatten LCD panels, and can be used to avoid problems of low brightness and light leakage in the dark state.

In order to achieve the aforementioned or other objects, the present invention further provides a method of fabricating the pixel structure. First, a substrate is provided, and a gate and a gate insulating layer are sequentially formed on the substrate, wherein the gate insulating layer covers the gate. Then, a semiconductor material layer is formed on the gate insulating layer. Next, the semiconductor material layer is patterned with a half tone mask, so as to form a semiconductor pattern on the gate insulating layer above the gate, and at least a recess is formed on a part of the surface of the semiconductor pattern. Next, a source/drain material layer is formed on the substrate. Subsequently, the source/drain material layer is patterned, so as to form a first source/drain and a second source/drain on the semiconductor pattern, wherein the second source/drain exposes the recess. Moreover, when the first source/drain and the second source/drain are formed by etching, a part of the semiconductor pattern is removed, so as to form a first channel layer corresponding to the first source/drain and a second channel layer corresponding to the second source/drain. Thereafter, a patterned dielectric layer is formed completely above the substrate, wherein the dielectric layer exposes a part of the first drain and a part of the second drain. Next, a first pixel electrode and a second pixel electrode are formed on the dielectric layer. The first pixel electrode and the second pixel electrode are electrically connected to the first drain and the second drain respectively.

In an embodiment of the present invention, the step of forming the semiconductor material layer comprises forming a channel material layer on the gate insulating layer. Next, an ion doping process is performed to form an ohmic contact material layer on the channel material layer. Moreover, when the first source/drain and the second source/drain are formed by etching, for example, the ohmic contact material layer exposed by the first source/drain and the second source/drain is completely removed, and a part of the channel material layer is removed.

In an embodiment of the present invention, the first source/drain and the second source/drain have a common source.

In order to achieve the aforementioned or other objects, the present invention provides another method of fabricating the pixel structure. First, a substrate is provided, and a gate material layer is formed on the substrate. Next, the gate material layer is patterned with a half tone mask, so as to form a gate on the substrate, and at least a first recess is formed on a part of the surface of the gate. Next, a gate insulating layer is formed on the substrate to cover the gate, and a second recess is formed on the gate insulating layer at a position corresponding to the first recess. Thereafter, a semiconductor pattern is formed on the gate insulating layer above the gate, and a third recess is formed on the semiconductor pattern at a position corresponding to the second recess. Next, a source/drain material layer is formed on the substrate. Subsequently, the source/drain material layer is patterned, so as to form a first source/drain and a second source/drain on the semiconductor pattern. The second source/drain exposes the third recess. And when the first source/drain and the second source/drain are formed by etching, a part of the semiconductor pattern is further removed, so as to form a first channel layer corresponding to the first source/drain and a second channel layer corresponding to the second source/drain. Next, a patterned dielectric layer is formed above the substrate, wherein the dielectric layer exposes a part of the first drain and a part of the second drain. Next, a first pixel electrode and a second pixel electrode are formed on the dielectric layer. The first pixel electrode and the second pixel electrode are electrically connected to the first drain and the second drain respectively.

In an embodiment of the present invention, the step of forming the semiconductor pattern comprises forming a channel material layer on the gate insulating layer. Next, an ion doping process is performed to form an ohmic contact material layer on the channel material layer. Next, the channel material layer and the ohmic contact material layer are patterned to form the semiconductor pattern. When the first source/drain and the second source/drain are formed by etching, for example, the ohmic contact material exposed by the first source/drain and the second source/drain is completely removed, and a part of the channel material layer is removed.

In an embodiment of the present invention, the first source/drain and the second source/drain have a common source.

The pixel structure of the present invention enables the corresponding pixel electrodes to have different charging rates through the change of the thickness of the channel layer, such that the liquid crystal molecules have different liquid crystal alignment effects. The pixel structure of the present invention has advantages of achieving the wide view angle, simple fabrication process, and high production yield.

In order to make the aforementioned and other objects, features and advantages of the present invention comprehensible, preferred embodiments accompanied with figures are described in detail below.

DESCRIPTION OF EMBODIMENTS

Conventional twisted nematic liquid crystal must be aligned in a manner of multiple regions, such that the LCD meets the requirement of wide view angle. Therefore, in view of the disadvantages of the conventional art, the present invention provides a new pixel structure capable of achieving the effect of wide view angle and a fabrication method thereof. The pixel structure of the present invention mainly uses a TFT as a switch element, and two pixel electrodes controlled according to different charging rates, so as to achieve different effect of liquid crystal alignment. More particularly, referring to formula (1) below:

$$I_{on}=0.5 \times u \times (W/L) \times (V_{gh}-V_{th})^2 \tag{1}$$

$I_{on}$ is the on current; u is the electron mobility; W is the channel width; L is the channel length; $V_{gh}$ is the gate driver turn-on voltage; and $V_{th}$ is the threshold voltage. It can be seen from the formula that when the threshold voltage $V_{th}$ changes, the on current $I_{on}$ changes accordingly. Furthermore, as the $I_{on}$ changes, the charging rate of the TFT to the pixel electrode also changes accordingly. The present invention provides designs channels of different thicknesses for different pixel electrodes, so as to obtain different threshold voltages $V_{th}$, thus achieving different liquid crystal alignment effects with the different pixel charging rates. Thus, the wide view angle LCD is accomplished.

The pixel structure of the present invention will be illustrated below first, and then the method of fabricating the pixel structure will be illustrated.

Figure 1A:
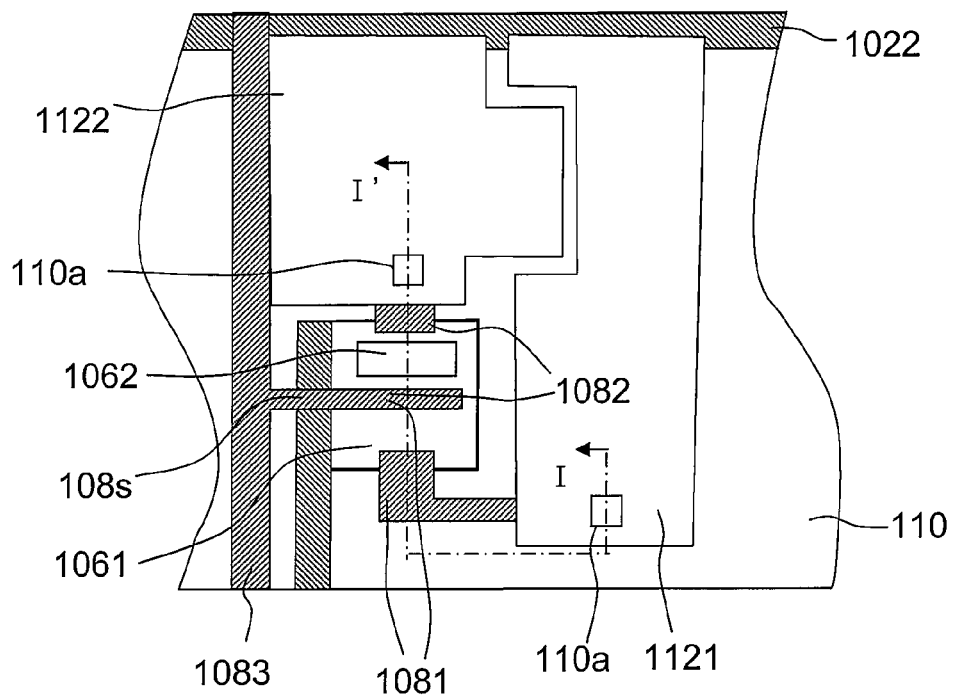
FIG. 1A is a top view of a pixel structure according to an embodiment of the present invention.
Figure 1B:
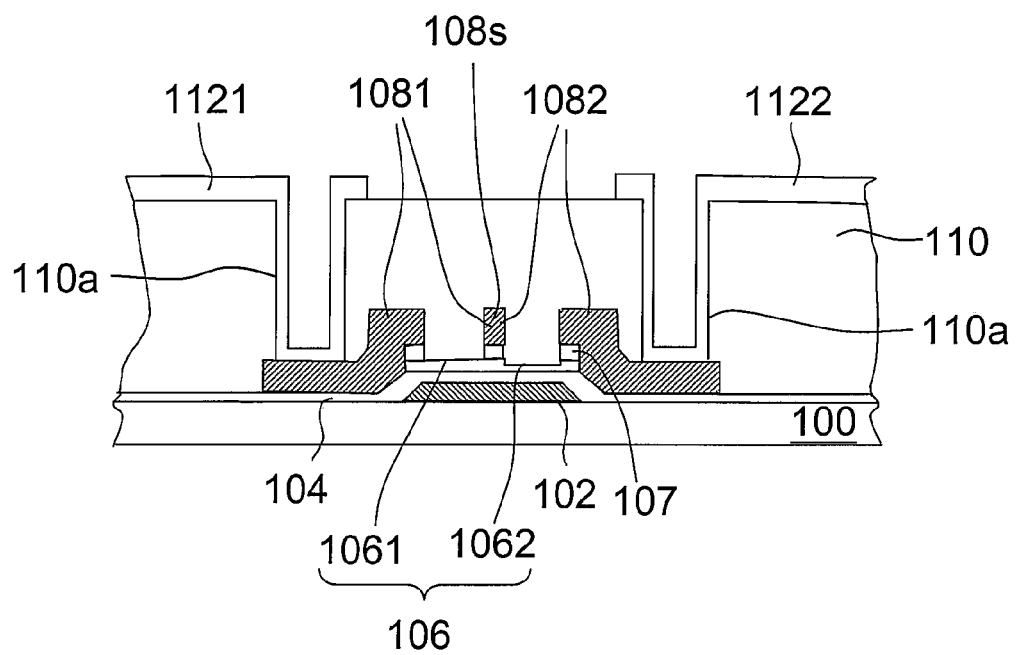
FIG. 1B is a cross-sectional view taken along the section line I-I' in FIG. 1A.

FIG. 1A is a top view of a pixel structure according to an embodiment of the present invention, and FIG. 1B is a cross-sectional view taken along the section line I-I' in FIG. 1A.

Referring to FIGS. 1A and 1B together, the pixel structure of the present invention comprises a substrate 100, a gate 102, a gate insulating layer 104, a channel layer 106, a first source/drain 1081, a second source/drain 1082, a dielectric layer 110, a first pixel electrode 1121, and a second pixel electrode 1122. The gate insulating layer 104 and the dielectric layer 110 are not shown in FIG. 1A for the convenience of observing the structure covered by the gate insulating layer 104 and the dielectric layer 110. Moreover, in the present embodiment, the pixel structure further comprises a scan line 1022 which is on the same layer as the gate 102. The pixel structure further comprises a data line 1083 which is on the same layer as the first source/drain 1081 and the second source/drain 1082.

The gate 102 is disposed on the substrate 100, the gate insulating layer 104 covers the gate 102, and the channel layer 106 is disposed on the gate insulating layer 104 above the gate 102. Moreover, the first source/drain 1081 and the second source/drain 1082 are disposed on the channel layer 106. The pixel structure further comprises an ohmic contact layer 107 disposed between the channel layer 106 and the first source/drain 1081 and between the channel layer 106 and the second source/drain 1082. The material of the ohmic contact layer 107 is, for example, doped amorphous silicon. In the present embodiment, the first source/drain 1081 and the second source/drain 1082, for example, have a common source 108s which is connected to the data line 1083. In other embodiments of the present invention, the first source/drain 1081 and the second source/drain 1082 can also adopt other arrangements, for example, each has an independent source and drain. The dielectric layer 110 covers the substrate 100. The dielectric layer 100 is a layer of patterned material that has contact openings 110a to expose a part of the first drain 1081 and a part of the second drain 1082. The first pixel electrode 1121 and the second pixel electrode 1122 are disposed on the dielectric layer 110, and are electrically connected to the first drain 1081 and the second drain 1082 via the contact openings 110a in the dielectric layer 110 respectively.

As described above, the present invention provides designs that the channel layer 106 has different thicknesses for the first pixel electrode 1121 and the second pixel electrode 1122, so as to achieve different liquid crystal alignment in the same pixel structure. The channel layer 106 has different thicknesses corresponding to the first source/drain 1081 and the second source/drain 1082 respectively. More particularly, the channel layer 106 can be divided into a first channel layer 1061 and a second channel layer 1062, in which the first source/drain 1081 corresponds to the first channel layer 1061, and the second source/drain 1082 corresponds to the second channel layer 1062. In the present embodiment, the thickness of the second channel layer 1062 is, for example, less than that of the first channel layer 1061, thus having a different threshold voltage $V_{th}$. As such, it can be seen from formula (1) that the first channel layer 1061 and the second channel layer 1062 can have different on currents $I_{on}$, such that the first pixel electrode 1121 and the second pixel electrode 1122 are driven with different charging rates.

Figure 1C:
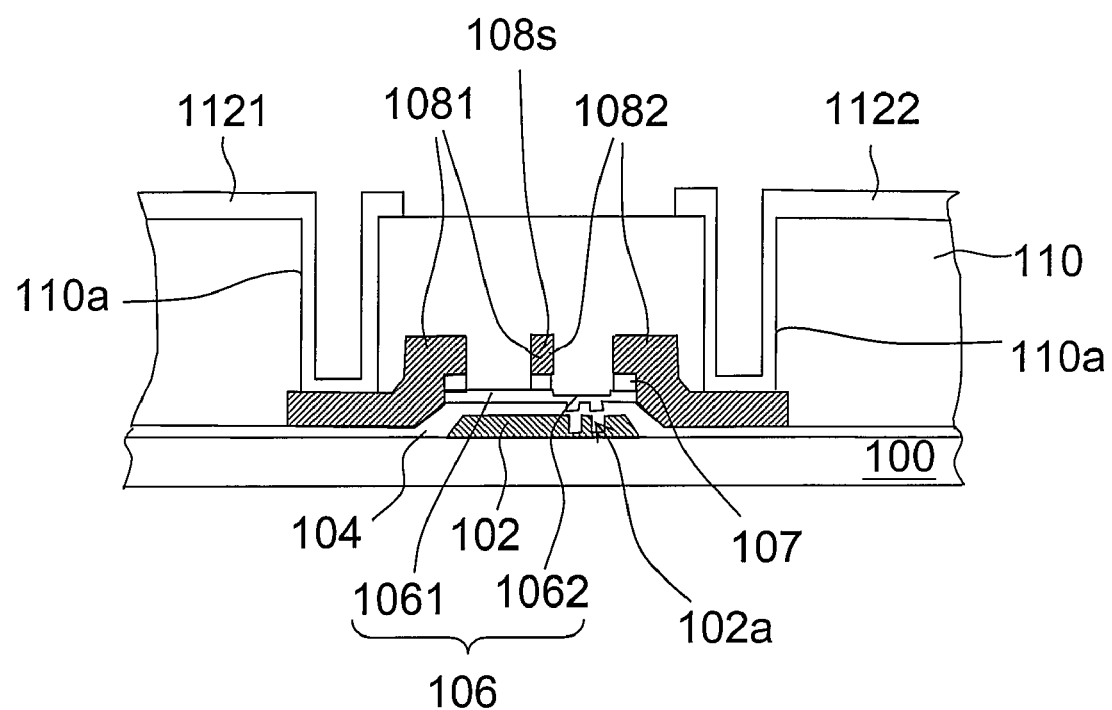
FIG. 1C is a schematic cross-sectional view of the pixel structure according to another embodiment of the present invention.

FIG. 1C is a schematic cross-sectional view of the pixel structure according to another embodiment of the present invention. The difference between the pixel structure of FIG. 1C and the pixel structure of FIG. 1B lies in that the surface of the gate 102 corresponding to the second source/drain 1082 has at least one recess 102a. The recess 102a is directed to form the first channel layer 1061 and the second channel layer 1062 of different thicknesses in the subsequent lithographic and etching processes, so as to achieve the aforementioned effect that the first pixel electrode 1121 and the second pixel electrode 1122 are driven with different charging rates. The detailed process will be illustrated below.

According to the illustration above, it can be easily understood by those of ordinary skill in the art that the principle of the present invention can be further applied in the pixel structure having two or more pixel electrodes. For example, in the pixel structure having three pixel electrodes, the channel layer can have three thickness values respectively corresponding to three pixel electrodes. Thus, the three pixel electrodes can be driven with three charging rates.

The pixel structure of the present invention can achieve different liquid crystal alignment effects without using additional structures such as alignment protrusions or slits. Therefore, the pixel structure of the present invention can be fabricated easily, thus facilitating flattening of the LCD panel, and avoiding problems of low brightness and light leakage in the dark state.

The methods of fabricating the pixel structures of FIGS. 1B and 1C will be illustrated below. However, it should be noted that the method of fabricating the pixel structure of the present invention is not limited to those described below, and pixel structures fabricated with the methods below can be slightly different from the pixel structures of FIGS. 1B and 1C.

FIGS. 2A-2E are top views of the method of fabricating the first pixel structure of the present invention. FIGS. 3A-3E are cross-sectional views taken along section lines II-II' of FIGS. 2A-2E respectively. The insulating layer and the dielectric layer are not shown in FIGS. 2A-2E for the convenience of observing the structure beneath the insulating layer and the dielectric layer.

Figure 2A:
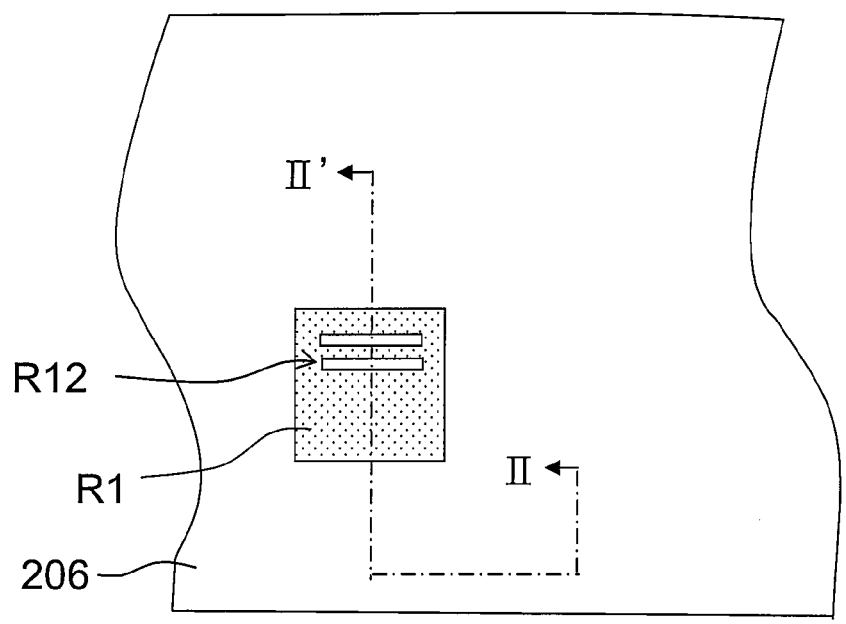
FIGS. 2A-2E are top views of a method of fabricating the pixel structure of the present invention.
Figure 3A:
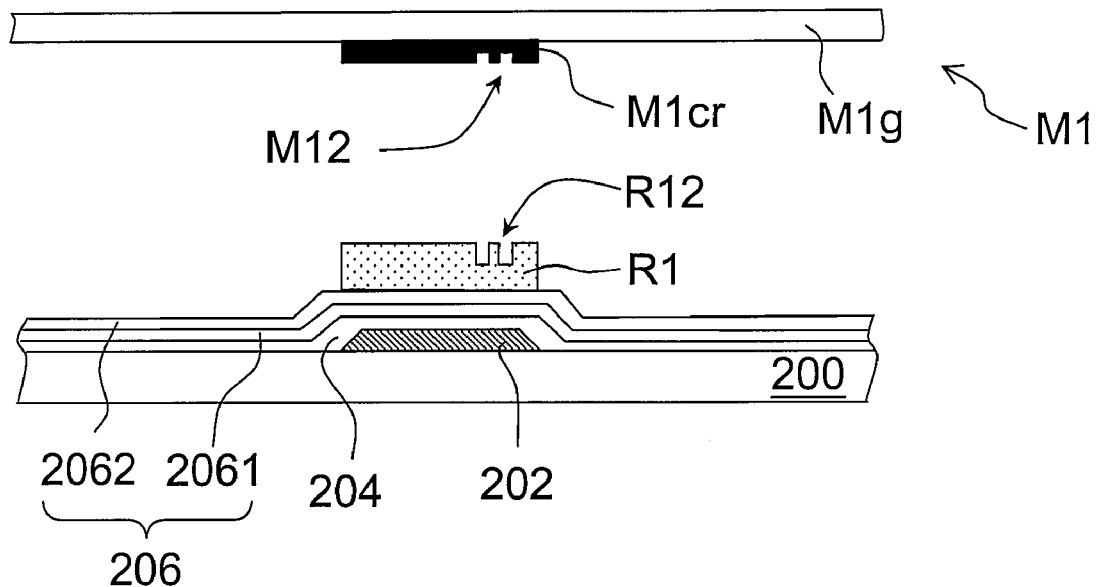
FIGS. 3A-3E are cross-sectional views taken along section lines II-II' of FIGS. 2A-2E respectively.

Referring to FIGS. 2A and 3A, the method of fabricating the pixel structure of the present invention comprises first providing a substrate 200, and sequentially forming a gate 202 and a gate insulating layer 204 on the substrate 200. The gate insulating layer 204 covers the gate 202. Moreover, when the gate 202 is formed, a scan line 2021 can be formed at the same time. Then, a semiconductor material layer 206 is formed on the gate insulating layer 204. The method of forming the semiconductor layer 206 includes, for example, first forming a channel material layer 2061 on the gate insulating layer 204, and then performing the ion doping process to form an ohmic contact material layer 2062 on the channel material layer 2061. Next, a patterned photoresist layer R1 is formed on the semiconductor material layer 206 with a half tone mask M1. In the present embodiment, the half tone mask M1 is constituted of a chromium film M1cr and glass M1g, wherein the chromium film M1cr can have uneven thickness, for example, have at least one recess M12, such that the half tone mask M1 has two or more optical transmittances. However, the present invention is not limited to using this type of half tone mask. In practical application, different types of half tone masks such as slit masks or stacked layers mask can be used to obtain the same exposing effect. The patterned photoresist layer R1 formed by exposing with the half tone mask M1 can have different thicknesses, for example, having a recess R12 corresponding to the recess M12.

Figure 2B:
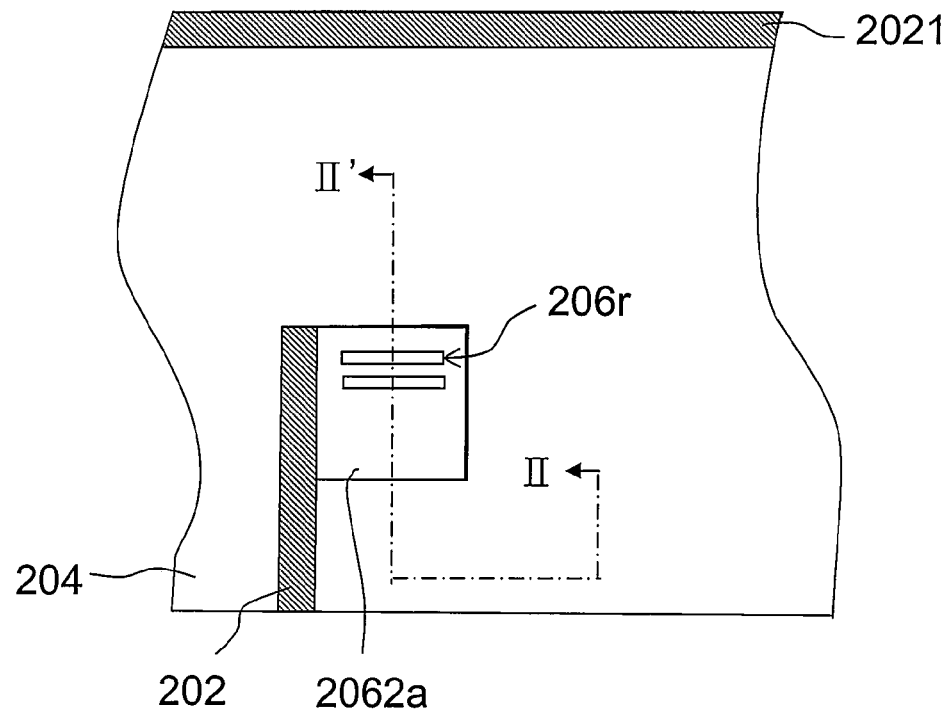
Figure 3B:
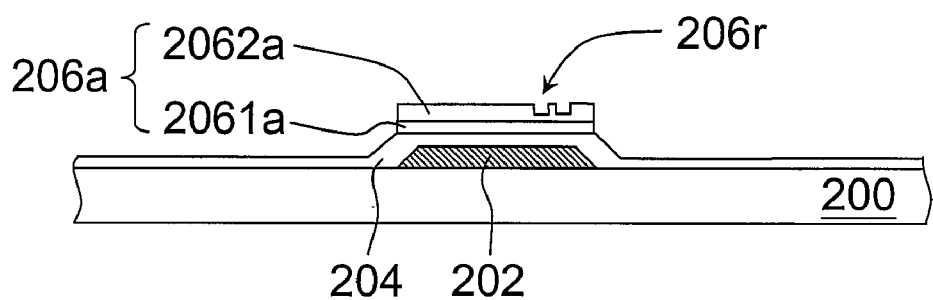

Next, referring to FIGS. 2B and 3B, the patterned photoresist layer R1 is used as a mask to pattern the semiconductor material layer 206, such that a semiconductor pattern 206a is formed on the gate insulating layer 204 above the gate 202. Next, the patterned photoresist layer R1 is removed. The method of patterning the semiconductor material layer 206 includes, for example, an etching process. A recess 206r can be formed on the surface of the semiconductor pattern 206a corresponding to the recess R12 by patterning the recess R12 on the patterned photoresist layer R1. In the present embodiment, the semiconductor pattern 206a comprises a channel layer 2061a and an ohmic contact layer 2062a on the channel layer 2061a which are obtained by respectively patterning the channel material layer 2061 and the ohmic contact material layer 2062. Moreover, the depth of the recess 206r of the present embodiment reaches the ohmic contact layer 2062a. However, the depth of the recess 206r is not limited in the present invention except that the depth of recess 206r must not reach the gate insulating layer 204. For example, in other embodiments, the depth of the recess 206r can reach the channel layer 2061a.

Figure 2C:
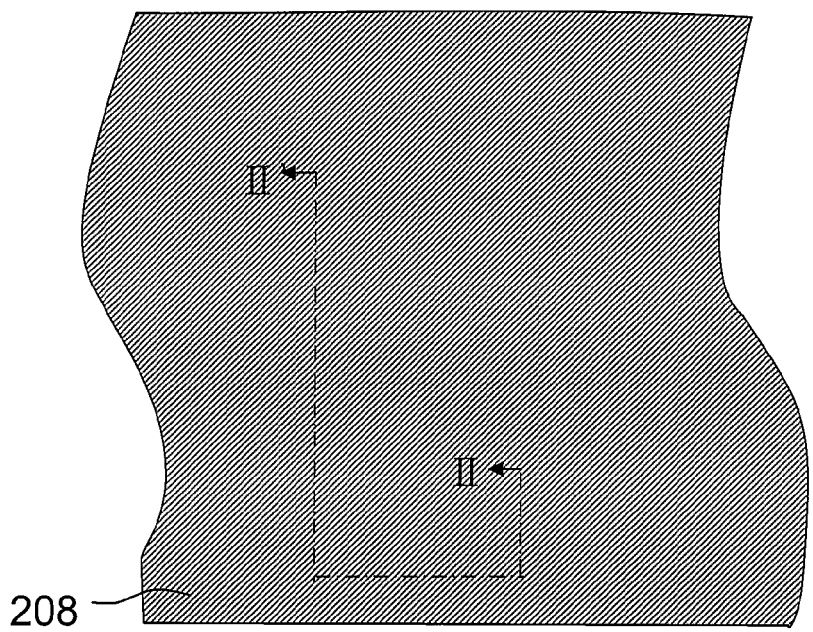
Figure 2D:
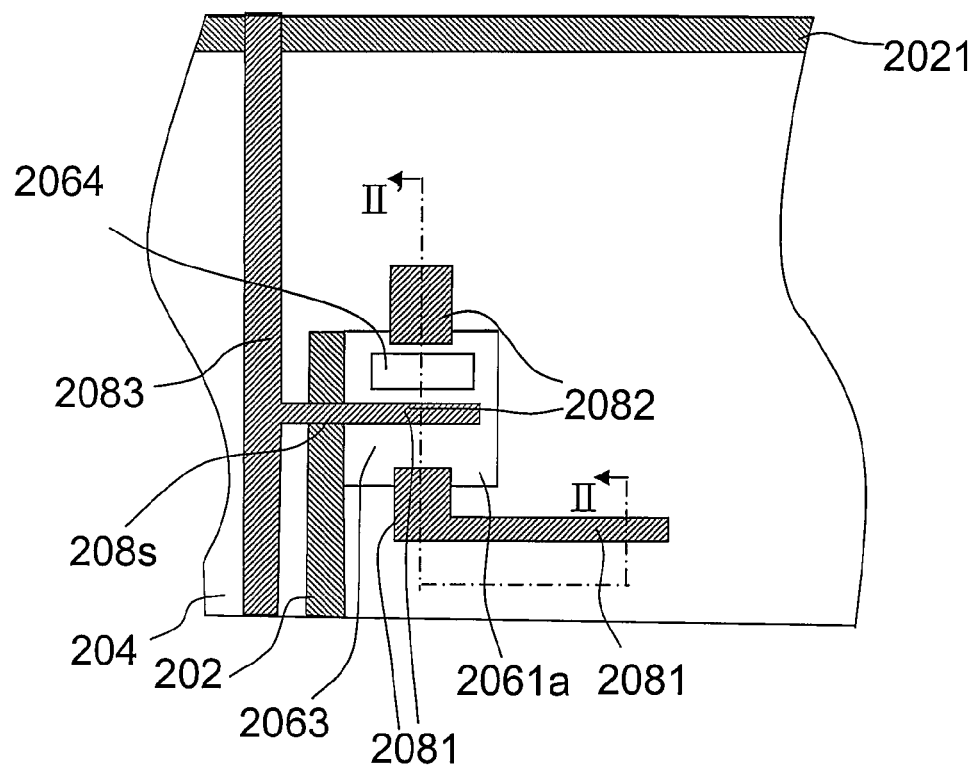
Figure 3C:
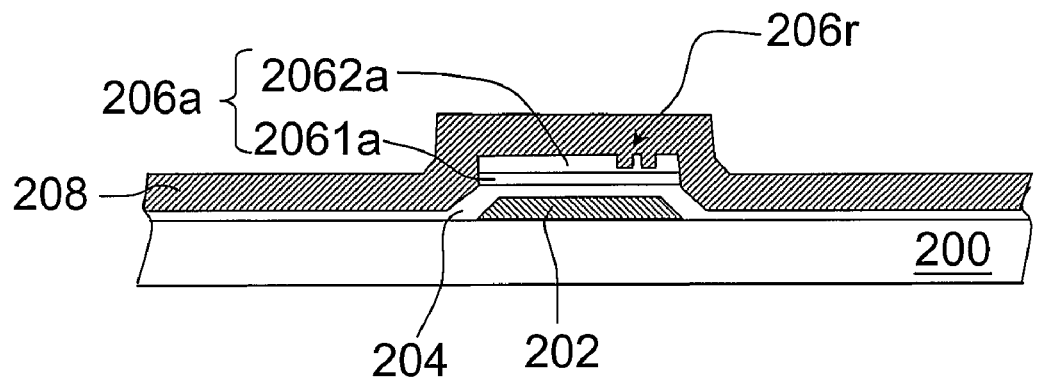
Figure 3D:
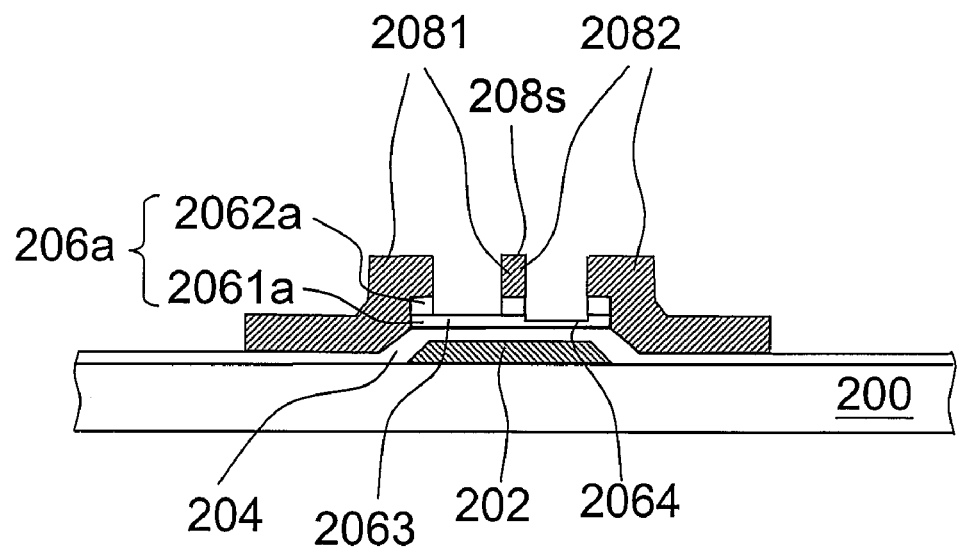

Referring to FIGS. 2C and 3C, a source/drain material layer 208 is formed above the substrate 200. Next, referring to FIGS. 2D and 3D, lithographic and etching processes are performed to pattern the source/drain material layer 208, so as to form a first source/drain 2081 and a second source/drain 2082 on the semiconductor pattern 206a, wherein the second source/drain 2082 exposes the recess 206r. Moreover, when the first source/drain 2081 and the second source/drain 2082 are formed, usually a data line 2083 is formed at the same time. In the present embodiment, the first source/drain 2081 and the second source/drain 2082, for example, have a common source 208s which is connected to the data line 2083.

It should be noted that when the first source/drain 2081 and the second source/drain 2082 are formed, a part of the semiconductor pattern 206a exposed by the first source/drain 2081 and the second source/drain 2082 is further removed, wherein at least the exposed ohmic contact layer 2062a and a part of the thickness of the channel layer 2061a must be removed. Since the recess 206r has been formed on the semiconductor pattern 206a in the preceding steps, when the etching process is performed, due to the different etching rates corresponding to materials of different thicknesses, a first channel layer 2063 and a second channel layer 2064 having different thicknesses are formed corresponding to the first source/drain 2081 and the second source/drain 2082 respectively. The first channel layer 2063 and the second channel layer 2064 of different thicknesses have different threshold voltages $V_{th}$ and correspondingly different on currents $I_{on}$. In other embodiments of the present invention, the same method (e.g., forming a plurality of recesses or trenches on the surface of the semiconductor pattern 206a) can be used to achieve the same effect.

Figure 2E:
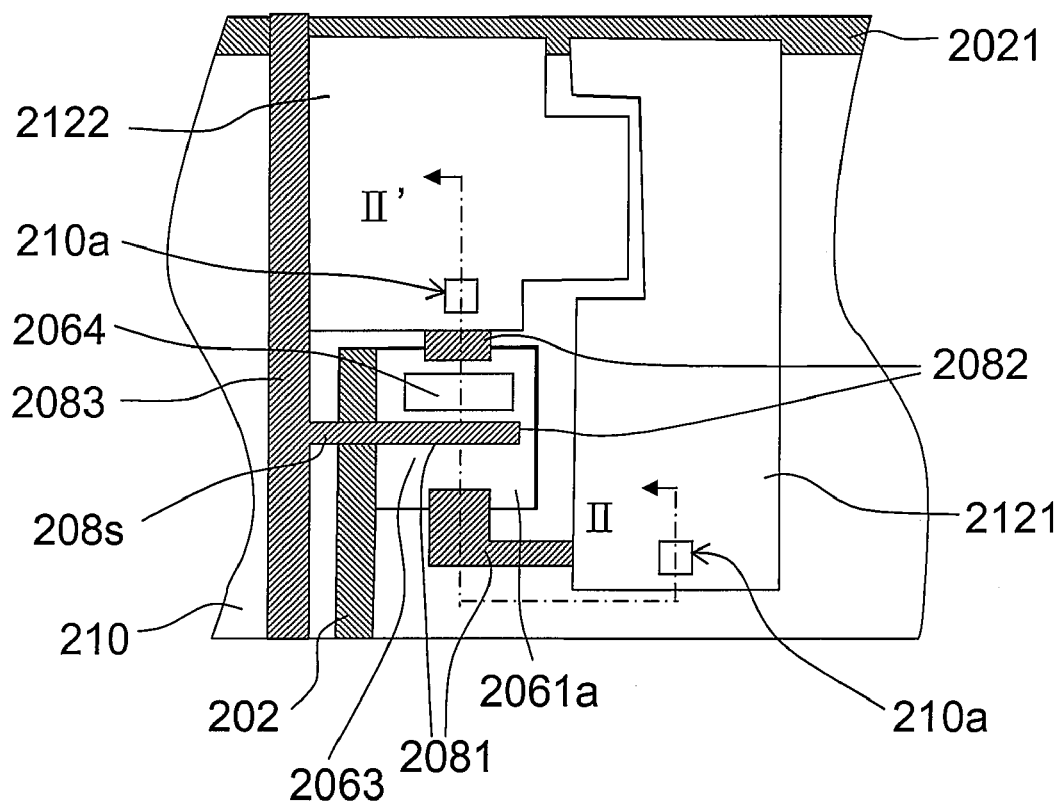
Figure 3E:
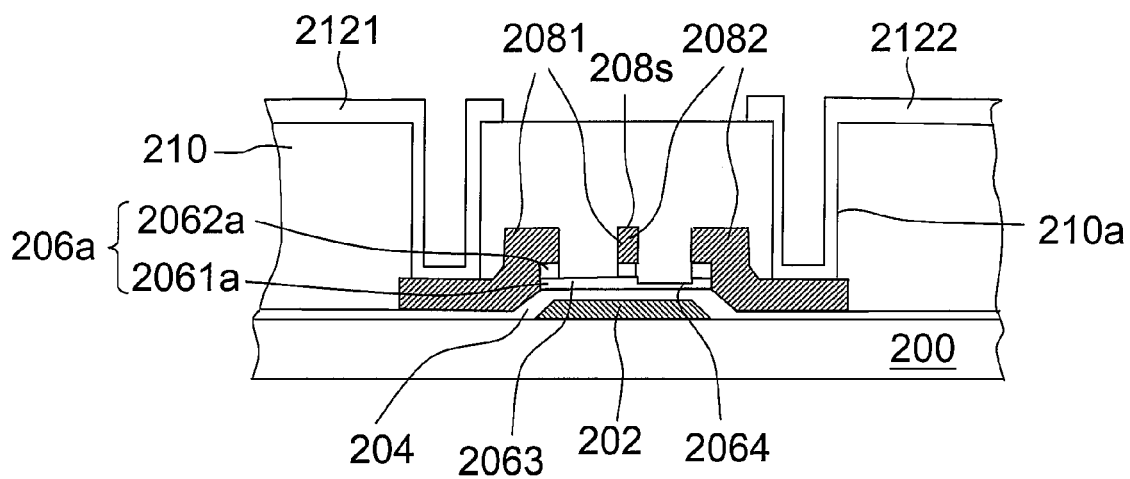

Next, referring to FIGS. 2E and 3E, a patterned dielectric layer 210 is formed completely above the substrate 200. The dielectric layer 210 has contact openings 210a to expose a part of the first drain 2081 and a part of the second drain 2082 respectively. Next, a first pixel electrode 2121 and a second pixel electrode 2122 are formed on the dielectric layer 210. The first pixel electrode 2121 and the second pixel electrode 2122 are electrically connected to the first drain 2081 and the second drain 2082 via the contact openings 210a in the dielectric layer 210 respectively. Since the first channel layer 2063 and the second channel layer 2064 have different threshold voltages $V_{th}$ and on currents $I_{on}$, the first pixel electrode 2121 and the second pixel electrode 2122 can be driven with different charging rates. Thus, different liquid crystal alignment effects can be achieved in the same pixel structure, and the view angle can be improved.

Another method of fabricating the pixel electrode of the present invention will be illustrated below. FIGS. 4A-4E are top views of a method of fabricating the pixel structure according to another embodiment of the present invention, and FIGS. 5A-5E are cross-sectional views taken along the section lines III-III' of FIGS. 4A-4E. Here, the insulating layer and the dielectric layer are not shown in FIGS. 4A-4E for the convenience of observing the structure beneath the insulating layer and the dielectric layer.

Figure 4A:
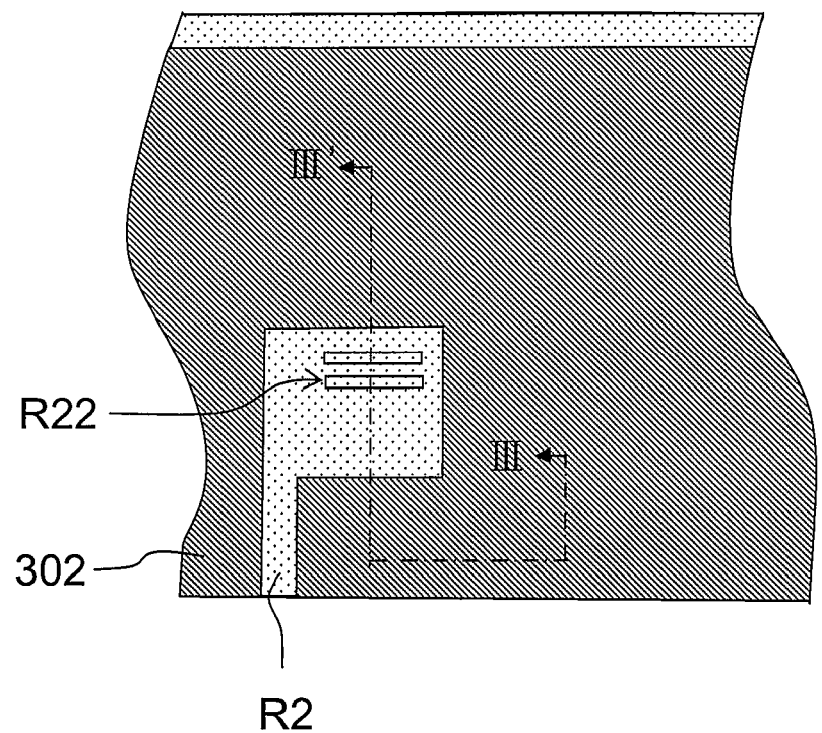
FIGS. 4A-4E are top views of another method of fabricating the pixel structure of the present invention.
Figure 5A:
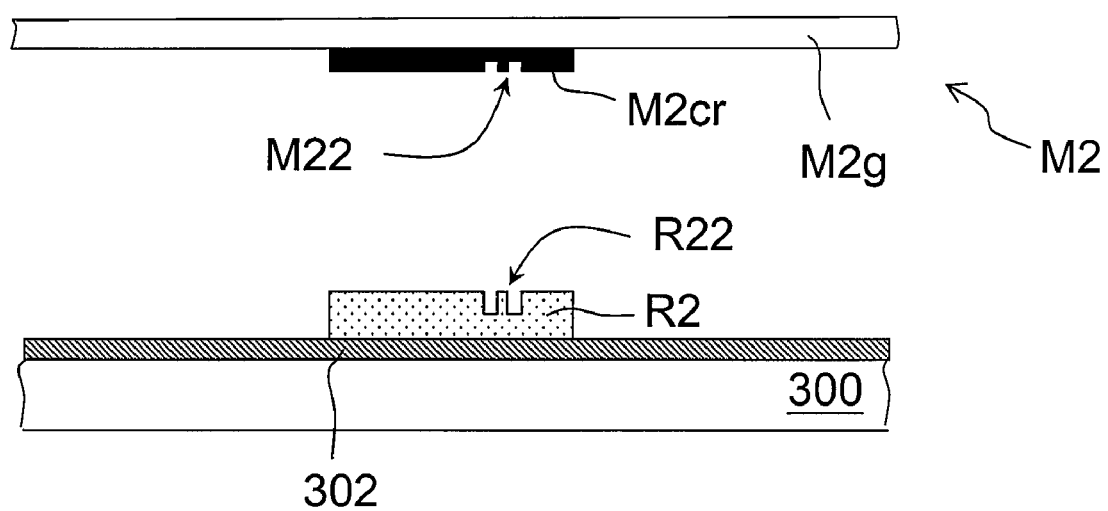
FIGS. 5A-5E are cross-sectional views taken along section lines III-III' of FIGS. 4A-4E respectively.

Referring to FIGS. 4A and 5A, the method of fabricating the pixel structure of the present invention comprises first providing a substrate 300. A gate material layer 302 is then formed on the substrate 300. Next, a patterned photoresist layer R2 is formed on the gate material layer 302 with a half tone mask M2. In the present embodiment, the half tone mask M2 is mainly constituted of, for example, a chromium film M2cr and glass M2g, wherein the chromium film M2cr, for example, has at least one recess M22, such that the half tone mask M2 has different optical transmittances, so as to correspondingly form a recess R22 on the patterned photoresist layer R2. As described in the aforementioned embodiment, the present invention can also use different types of half tone masks such as a slit mask or a stacked layers mask.

Figure 4B:
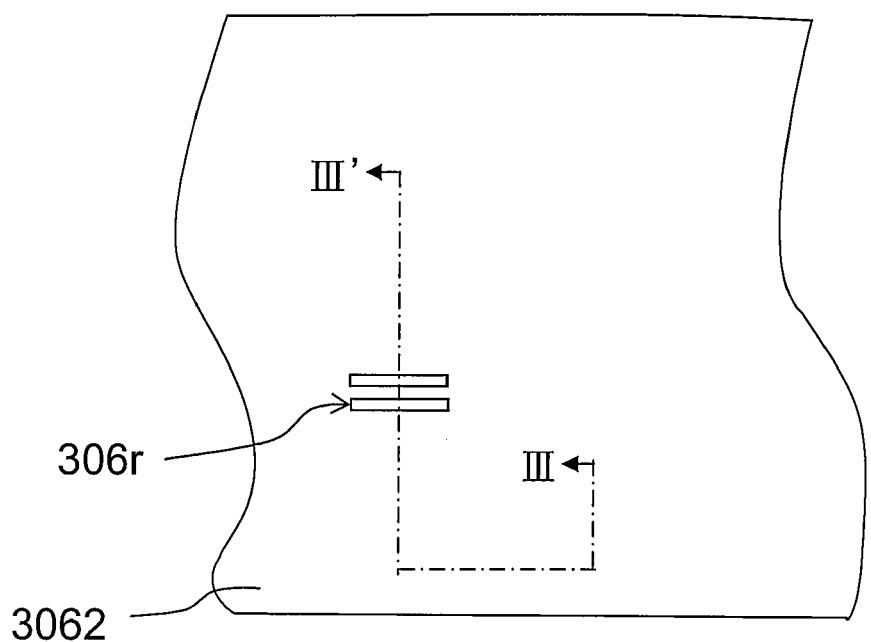
Figure 5B:
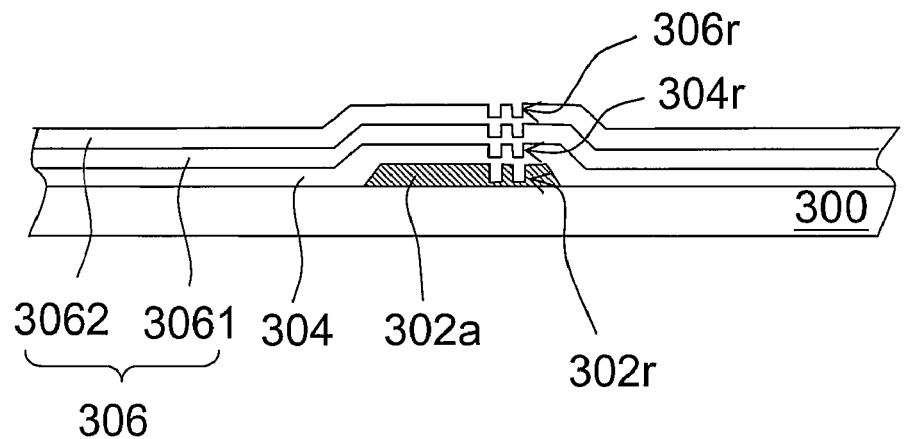

Next, referring to FIGS. 4B and 5B, the patterned photoresist layer R2 is used as the mask to pattern the gate material layer 302, so as to form a gate 302a, and a first recess 302r is formed on the surface of the gate 302a corresponding to the recess R22. Moreover, when the gate 302a is formed, a scan line 3021 can be formed at the same time. The patterned photoresist layer R2 is then removed. Next, a gate insulating layer 304 is formed on the substrate 300 to covers the gate 302a. Moreover, a second recess 304r is formed on the gate insulating layer 304 at a position corresponding to the first recess 302r. And then a semiconductor material layer 306 is formed on the gate insulating layer 304 above the gate 302a, and a third recess 306r is formed on the semiconductor material layer 306 at a position corresponding to the second recess 304r. The method of forming the semiconductor layer 306 includes, for example, first forming a channel material layer 3061 on the gate insulating layer 304, and then performing an ion doping process to form an ohmic contact material layer 3062 on the channel material layer 3061.

Figure 4C:
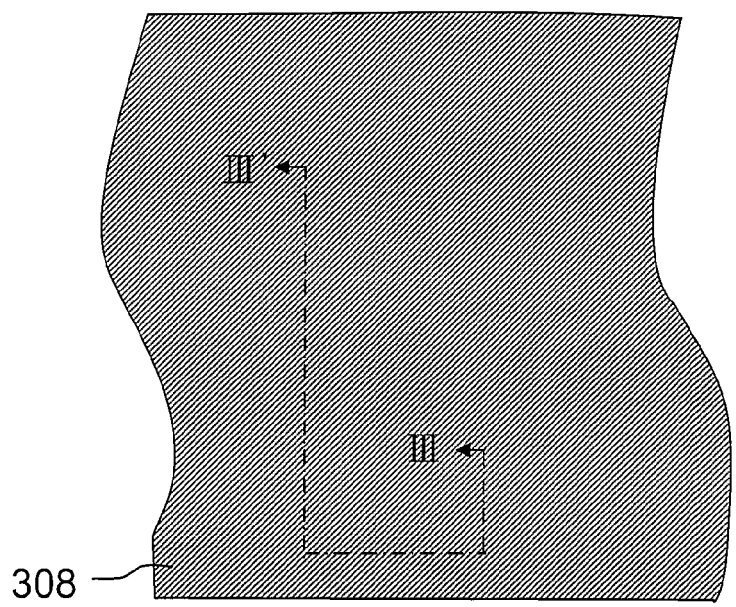
Figure 5C:
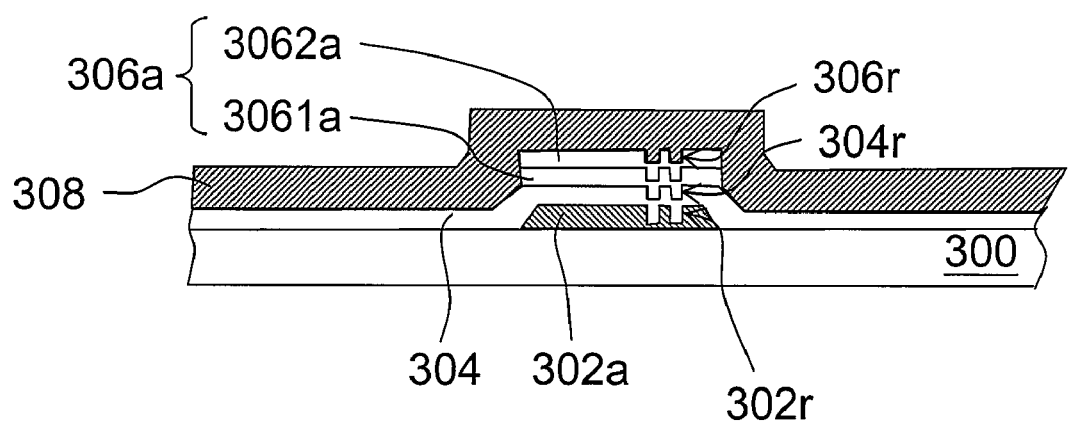

Subsequently, referring to FIGS. 4C and 5C, the semiconductor material layer 306 is patterned to form a semiconductor pattern 306a. In the present embodiment, the semiconductor pattern 306a comprises a channel layer 3061a and an ohmic contact layer 3062a on the channel layer 3061a, which are obtained by respectively patterning the channel material layer 3061 and the ohmic contact material layer 3062. Next, a source/drain material layer 308 is formed above the substrate 300.

Figure 4D:
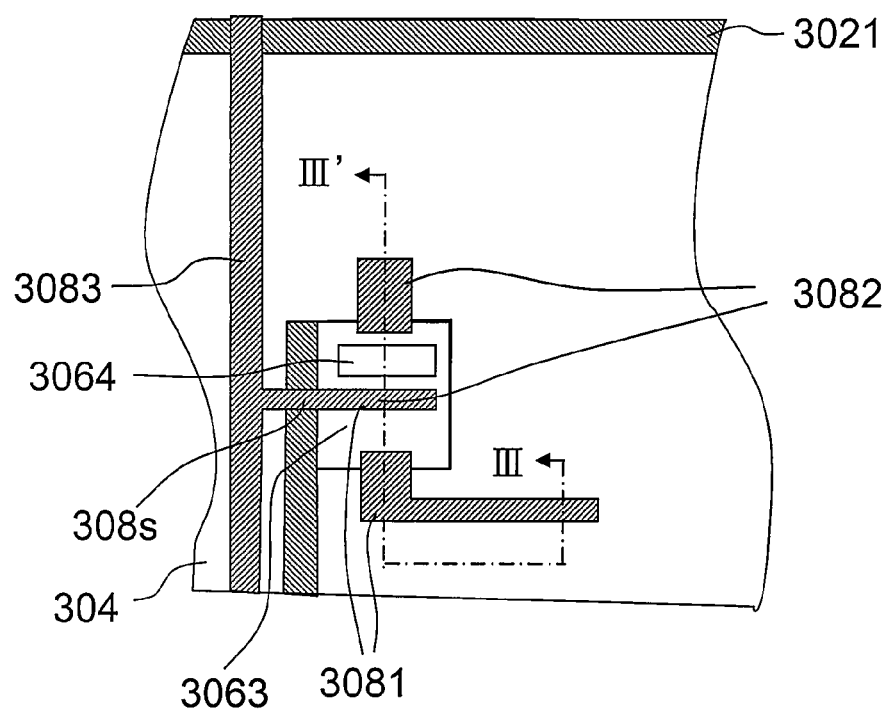
Figure 5D:
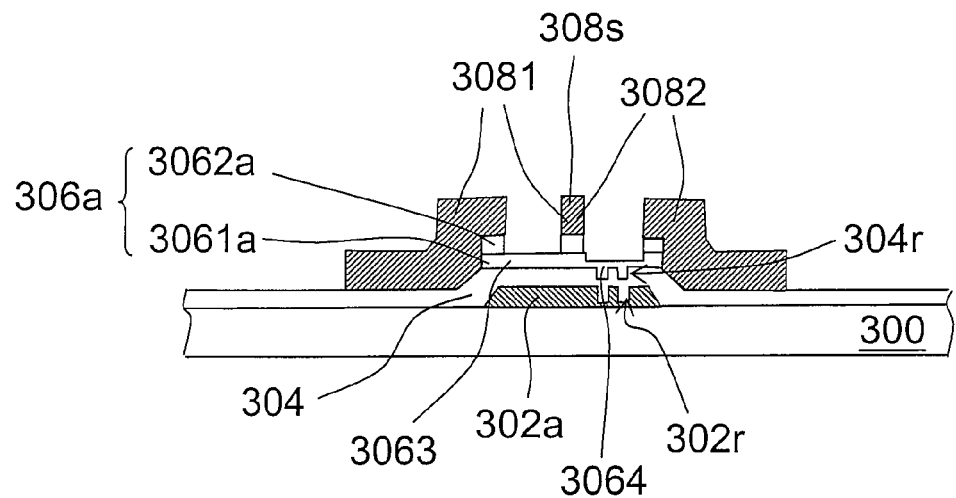

Referring to FIGS. 4D and 5D together, lithographic and etching process are performed to pattern the source/drain material layer 308, so as to form a first source/drain 3081 and a second source/drain 3082 on the semiconductor pattern 306a. The second source/drain 3082 exposes the third recess 306r. Moreover, when the first source/drain 3081 and the second source/drain 3082 are formed, usually a data line 3083 is formed at the same time. In the present embodiment, the first source/drain 3081 and the second source/drain 3082, for example, have a common source 308s which is connected to the data line 3083.

Moreover, when the first source/drain 3081 and the second source/drain are formed by etching, a part of the semiconductor pattern 306a, i.e. the exposed ohmic contact layer 3062a and a part of the thickness of the channel layer 3061a, is further removed, so as to form a first channel layer 3063 and a second channel layer 3064 respectively corresponding to the first source/drain 3081 and the second source/drain 3082. Since the third recess 306r is initially formed on the semiconductor pattern 306a corresponding to the second source/drain 3082, the first channel layer 3063 and the second channel layer 3064 of different thicknesses can be formed after etching. In the present embodiment, the thickness of the second channel layer 3064 is, for example, less than that of the first channel layer 3063.

Figure 4E:
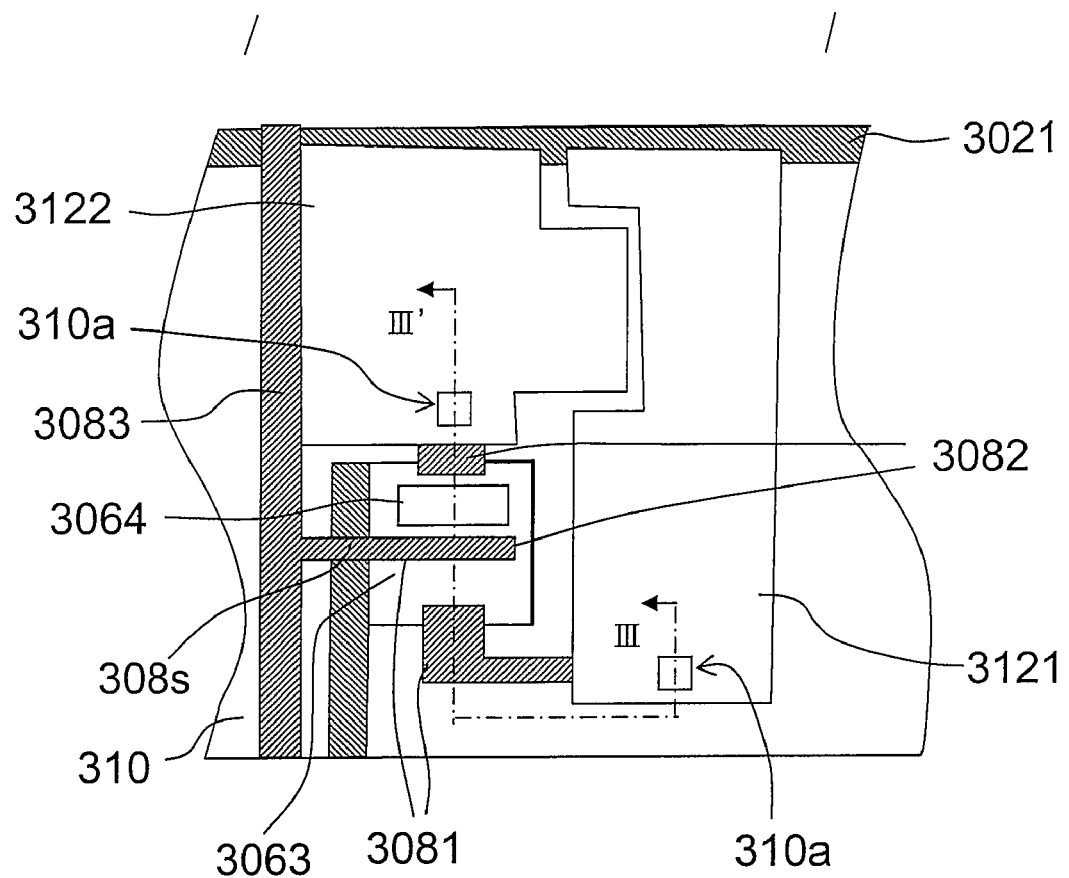
Figure 5E:
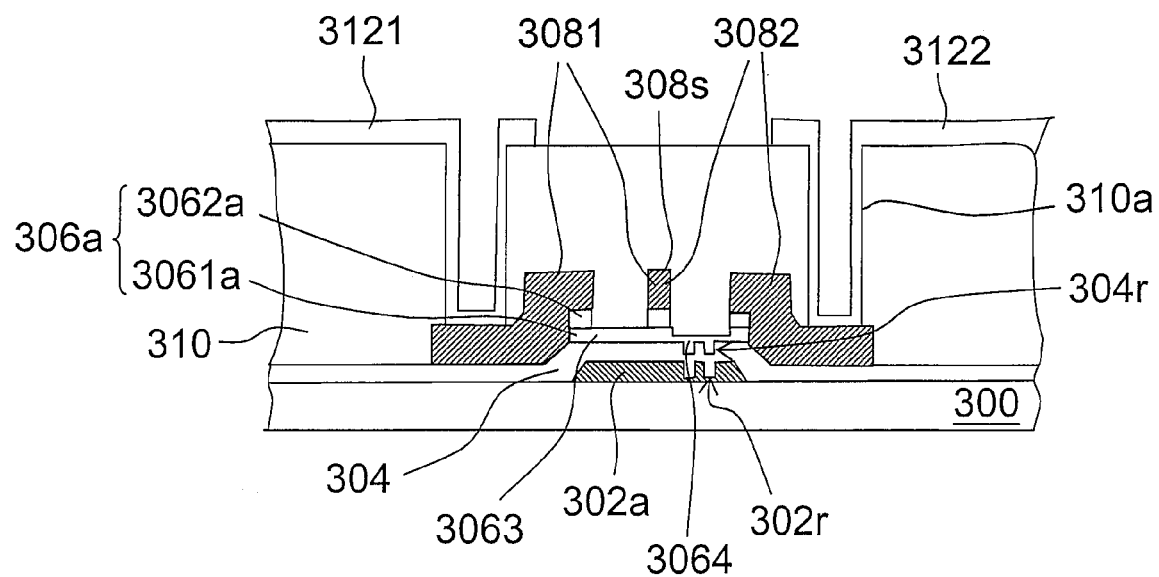

Then, referring to FIGS. 4E and 5E together, a patterned dielectric layer 310 is formed completely above the substrate 300. The dielectric layer 310 has contact openings 310a to expose a part of the first drain 3081 and a part of the second drain 3082 respectively. Then, a first pixel electrode 3121 and a second pixel electrode 3122 are formed on the dielectric layer 310. The first pixel electrode 3121 and the second pixel electrode 3122 are electrically connected to the first drain 3081 and the second drain 3082 via the contact openings 310a in the dielectric layer 310 respectively. Since the first channel layer 3063 and the second channel layer 3064 have different threshold voltages $V_{th}$ and on currents $I_{on}$, the first pixel electrode 3121 and the second pixel electrode 3122 can be driven with different charging rates. As such, different liquid crystal alignment effects can be realized in a same pixel structure, and the view angle can be improved.

The pixel structure and the fabrication method thereof provided by the present invention mainly comprise forming a channel layer with different thicknesses in the same pixel, such that individual pixel electrodes can have different charging rates. Thus, different pixel electrodes in the same pixel can have different display voltages after being charged, such that the corresponding liquid crystal molecules have different alignments, so as to compensate the view angle. Compared with conventional alignment techniques (e.g., the MVA technique), alignment protrusions and slits and additional masks are not required in the present invention. Therefore, the fabrication process is simplified, and the LCD panels can be flattened, and problems of lower brightness and light leakage in the dark state can be avoided. In other words, the pixel structure of the present invention has advantages of achieving the wide view angle, simple fabrication process, and high production yield.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the appending claims and their equivalents.

What is claimed is:

1. A pixel structure, comprising:
   a substrate;
   a gate disposed on the substrate;
   a gate insulating layer covering the gate;
   a channel layer disposed on the gate insulating layer above the gate;
   a first source/drain and a second source/drain disposed on the channel layer, wherein a thickness of the part of the channel layer corresponding to the first source/drain is different from a thickness of the part of the channel layer corresponding to the second source/drain;
   a patterned dielectric layer covering the substrate and exposing a part of the first source/drain and a part of the second source/drain; and
   a first pixel electrode and a second pixel electrode disposed on the dielectric layer and electrically connected to the first drain and the second source/drain respectively.

2. The pixel structure as claimed in claim 1, further comprising an ohmic contact layer disposed between the channel layer and the first source/drain and between the channel layer and the second source/drain.

3. The pixel structure as claimed in claim 2, wherein the material of the ohmic contact layer is doped amorphous silicon.

4. The pixel structure as claimed in claim 1, wherein a surface of the gate corresponding to the second source/drain comprises at least a recess.

5. The pixel structure as claimed in claim 1, wherein the first source/drain and the second source/drain comprise a common source.

6. A method of fabricating a pixel structure, comprising:
   providing a substrate;
   sequentially forming a gate and a gate insulating layer on the substrate, wherein the gate insulating layer covers the gate;
   forming a semiconductor material layer on the gate insulating layer;
   patterning the semiconductor material layer with a half tone mask to form a semiconductor pattern on the gate insulating layer above the gate and form at least a recess on a part of a surface of the semiconductor pattern;
   forming a source/drain material layer on the substrate;
   patterning the source/drain material layer to form a first source/drain and a second source/drain on the semiconductor pattern, wherein the second source/drain exposes a portion of the recess, and when the first source/drain and the second source/drain are formed by etching, a part of the semiconductor pattern is further removed to form a first channel layer and a second channel layer of different thicknesses respectively corresponding to the first source/drain and the second source/drain;
   forming a patterned dielectric layer above the substrate, wherein the dielectric layer exposes a part of the first source/drain and a part of the second source/drain; and
   forming a first pixel electrode and a second pixel electrode on the dielectric layer, wherein the first pixel electrode and the second pixel electrode are electrically connected to the first source/drain and the second source/drain respectively.

7. The method as claimed in claim 6, wherein the step of forming the semiconductor material layer comprises:
   forming a channel material layer on the gate insulating layer; and
   performing an ion doping process to form an ohmic contact material layer on the channel material layer.

8. The method as claimed in claim 7, wherein when the first source/drain and the second source/drain are formed by etching, the ohmic contact material layer exposed by the first source/drain and the second source/drain is completely removed, and a part of the channel material layer is removed.

9. The method as claimed in claim 6, wherein the first source/drain and the second source/drain have a common source.

10. A method of fabricating a pixel structure, comprising:
    providing a substrate;
    forming a gate material layer on the substrate;
    patterning the gate material layer with a half tone mask to form a gate on the substrate and form at least a first recess on a part of the surface of the gate;
    forming a gate insulating layer on the substrate to cover the gate, thereby forming a second recess on the gate insulating layer at a position corresponding to the first recess;
    forming a semiconductor pattern on the gate insulating layer above the gate, thereby forming a third recess on the semiconductor pattern at a position corresponding to the second recess;
    forming a source/drain material layer on the substrate;
    patterning the source/drain material layer to form a first source/drain and a second source/drain on the semiconductor pattern, wherein the second source/drain exposes the third recess, and when the first source/drain and the second source/drain are formed by etching, a part of the semiconductor pattern is further removed to form a first channel layer and a second channel layer of different thicknesses respectively corresponding to the first source/drain and the second source/drain;
    forming a patterned dielectric layer above the substrate, wherein the dielectric layer exposes a part of the first source/drain and a part of the second/drain; and
    forming a first pixel electrode and a second pixel electrode on the dielectric layer, wherein the first pixel electrode and the second pixel electrode are electrically connected to the first source/drain and the second source/drain respectively.

11. The method as claimed in claim 10, wherein the step of forming the semiconductor pattern comprises:
    forming a channel material layer on the gate insulating layer;
    performing an ion doping process to form an ohmic contact material layer on the channel material layer; and
    patterning the channel material layer and the ohmic contact material layer to form the semiconductor pattern.

12. The method as claimed in claim 11, wherein when the first source/drain and the second source/drain are formed by etching, the ohmic contact material layer exposed by the first source/drain and the second source/drain is completely removed, and a part of the channel material layer is removed.

13. The method as claimed in claim 10, wherein the first source/drain and the second source/drain have a common source.

* * * * *